United States Patent
Ahn et al.

(10) Patent No.: US 8,970,768 B2
(45) Date of Patent: Mar. 3, 2015

(54) UNIT PIXEL ARRAY AND IMAGE SENSOR HAVING THE SAME

(75) Inventors: Jung-Chak Ahn, Yongin-si (KR); Bum-Suk Kim, Hwaseong-si (KR); Kyung-Ho Lee, Suwon-si (KR); Eun-Sub Shim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 241 days.

(21) Appl. No.: 13/218,550

(22) Filed: Aug. 26, 2011

(65) Prior Publication Data
US 2012/0050600 A1 Mar. 1, 2012

(30) Foreign Application Priority Data
Aug. 30, 2010 (KR) ......................... 10-2010-0084074

(51) Int. Cl.
| | | |
|---|---|---|
| H04N 9/083 | (2006.01) | |
| H04N 3/14 | (2006.01) | |
| H04N 5/335 | (2011.01) | |
| H04N 9/04 | (2006.01) | |
| H04N 5/225 | (2006.01) | |
| H01L 31/062 | (2012.01) | |
| H01L 31/113 | (2006.01) | |
| H01L 21/00 | (2006.01) | |
| H01L 27/146 | (2006.01) | |

(52) U.S. Cl.
CPC ...... H01L 27/14629 (2013.01); H01L 27/1464 (2013.01); H01L 27/14621 (2013.01); H01L 27/14627 (2013.01)
USPC ........... 348/340; 348/280; 348/281; 257/294; 438/72

(58) Field of Classification Search
USPC .......... 348/272, 280, 281, 336, 340; 257/294, 257/440; 438/69–70, 72
See application file for complete search history.

(56) References Cited

U.S. PATENT DOCUMENTS

| | | | |
|---|---|---|---|
| 6,794,216 B2 * | 9/2004 | Ko | 438/72 |
| 7,488,616 B2 * | 2/2009 | Hwang | 438/65 |
| 7,868,528 B2 | 1/2011 | Kobayashi | |
| 8,139,131 B2 * | 3/2012 | Komatsu et al. | 348/294 |
| 2004/0180461 A1 * | 9/2004 | Yaung et al. | 438/48 |
| 2007/0237888 A1 * | 10/2007 | Liu et al. | 427/58 |
| 2009/0200622 A1 * | 8/2009 | Tai et al. | 257/432 |
| 2010/0207225 A1 * | 8/2010 | Masuda | 257/432 |
| 2010/0245638 A1 * | 9/2010 | Ota | 348/280 |
| 2010/0253819 A1 * | 10/2010 | Yokozawa | 348/273 |

FOREIGN PATENT DOCUMENTS

| | | |
|---|---|---|
| JP | 2009-117343 A | 5/2009 |
| KR | 10-2001-0059238 A | 7/2001 |
| KR | 10-0720493 B1 | 5/2007 |
| KR | 10-2008-0062949 A | 7/2008 |

* cited by examiner

*Primary Examiner* — Daniel M Pasiewicz
(74) *Attorney, Agent, or Firm* — Lee & Morse, P.C.

(57) ABSTRACT

A unit pixel array of an image sensor includes a semiconductor substrate having a plurality of unit pixels, an interlayer insulating layer disposed on a front side of the semiconductor substrate, a plurality of color filters disposed on a back side of the semiconductor substrate, a plurality of light path converters, each of the light path converters being disposed adjacent to at least one color filter and having a pair of slanted side edges extending from opposing ends of a horizontal bottom edge, and a plurality of micro lenses disposed on the color filters.

15 Claims, 12 Drawing Sheets

UNIT PIXEL ARRAY AND IMAGE SENSOR HAVING THE SAME

CROSS-REFERENCE TO RELATED APPLICATION

Korean Patent Application No. 2010-0084074, filed on Aug. 30, 2010 in the Korean Intellectual Property Office (KIPO), and entitled: "Unit Pixel Array and Image Sensor Having the Same," is incorporated by reference herein in its entirety.

BACKGROUND

1. Technical Field

Example embodiments relate to a unit pixel array and an image sensor having the same.

2. Description of the Related Art

An image sensor is a device that transforms incident light to an electric signal. A charge coupled device (CCD) image sensor and a complementary metal oxide semiconductor (CMOS) image sensor are widely used. Generally, incident light reaches a target unit pixel after passing through a micro lens and a color filter in the image sensor.

SUMMARY

Embodiments are directed to a unit pixel array and an image sensor having the same.

According to some example embodiments, a unit pixel array of an image sensor may include a semiconductor substrate having a plurality of unit pixels, an interlayer insulating layer on a front side of the semiconductor substrate, a plurality of color filters on a back side of the semiconductor substrate, a plurality of light path converters, (each of the light path converters being adjacent to at least one color filter, and having a pair of slanted side edges extending from opposing ends of a horizontal bottom edge), and a plurality of micro lenses on the color filters.

In some embodiments, the light path converters may be refractive bodies that refract incident light.

In some embodiments, a refractive index of the refractive bodies may be less than a refractive index of the color filters.

In some embodiments, the refractive bodies may have a triangular cross section or a trapezoidal cross section.

In some embodiments, the refractive bodies may have a slope angle such that light incident on the refractive bodies is refracted and illuminates target unit pixels.

In some embodiments, the light path converters may be reflective bodies that reflect incident light.

In some embodiments, the reflective bodies may be formed of at least one material selected from the group of silicon (Si), titanium (Ti), titanium nitride (TiN), aluminum (Al), copper (Cu), and tungsten (W).

In some embodiments, the reflective bodies may have a triangular cross section or a trapezoidal cross section.

In some embodiments, the reflective bodies may have a slope angle such that light incident on the reflective bodies is reflected and illuminates target unit pixels.

In some embodiments, the color filters may include at least one red filter, at least one green filter, and at least one blue filter.

In some embodiments, the color filters may include at least one yellow filter, at least one cyan filter, and at least one magenta filter.

According to some example embodiments, an image sensor may include a unit pixel array that generates an image signal by performing photoelectric transformations and a logic circuit that processes the image signal. The unit pixel array may include a semiconductor substrate having a plurality of unit pixels, an interlayer insulating layer on a front side of the semiconductor substrate, a plurality of color filters on a back side of the semiconductor substrate, a plurality of light path converters (each of the light path converters being disposed adjacent to at least one color filter, and having a pair of slanted side edges extending from opposing ends of a horizontal bottom edge), and a plurality of micro lenses formed on the color filters.

In some embodiments, the light path converters may be refractive bodies that refract incident light.

In some embodiments, a refractive index of the refractive bodies may be less than a refractive index of the color filters.

In some embodiments, the refractive bodies may have a triangular cross section or a trapezoidal cross section.

In some embodiments, the refractive bodies may have a slope angle such that light incident on the refractive bodies is refracted and illuminates target unit pixels.

In some embodiments, the light path converters may be reflective bodies that reflect incident light.

In some embodiments, the reflective bodies may have a triangular cross section or a trapezoidal cross section.

In some embodiments, the reflective bodies may have a slope angle such that light incident on the reflective bodies is reflected and illuminates target unit pixels.

According to some example embodiments, a unit pixel array may include a semiconductor substrate having a plurality of unit pixels, the semiconductor substrate may have a plurality of color filters and a plurality of light path converters on a back side thereof (each color filter may be adjacent to at least two light path converters) and the plurality of light path converters may be refractive bodies or reflective bodies.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
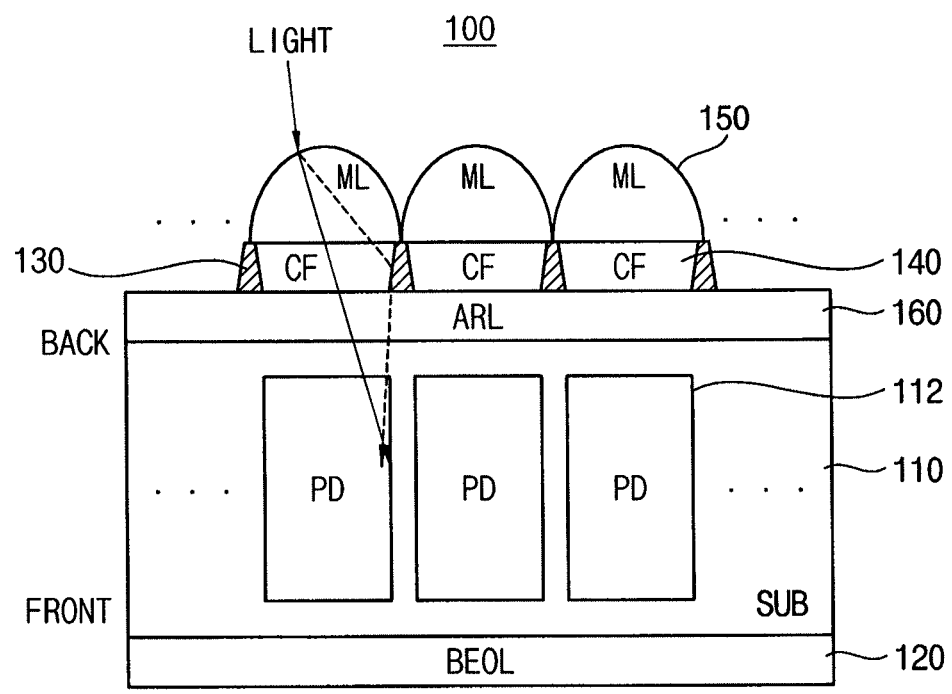
FIG. 1 illustrates a diagram of a unit pixel array of an image sensor according to some example embodiments.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a diagram of a unit pixel array of an image sensor according to some example embodiments.

Referring to FIG. 1, the unit pixel array 100 of an image sensor may include a semiconductor substrate 110, an interlayer insulating layer 120, light path converters 130, color filters 140, and micro lenses 150. According to some example embodiments, the unit pixel array 100 of an image sensor may further include an anti-reflective layer 160 that is laminated between a back side BACK of the semiconductor substrate 110 and the color filters 140, and an anti-reflective layer (not illustrated) that is laminated between a front side FRONT of the semiconductor substrate 110 and the interlayer insulating layer 120.

The semiconductor substrate 110 may include a plurality of unit pixels for capturing incident light. For convenience of description, the unit pixels are illustrated only as a photodiode 112 corresponding to a photo sensing device in FIG. 1. According to some example embodiments, the photo sensing device may be selected from the group of a photodiode, a photo transistor, a photo gate, a pinned photodiode, and a combination thereof. The semiconductor substrate 110 may be a (p)-type epitaxial substrate. Here, the photodiode 112 may be formed by implanting (n)-type ions into the semiconductor substrate 110. In the unit pixel array 100 of an image sensor, the unit pixels may be arranged in a matrix form. As illustrated in FIG. 1, the light may illuminate through the back side BACK of the semiconductor substrate 110 after passing through the micro lenses 150 and the color filters 140. Thus, an image sensor having the unit pixel array 100 of FIG. 1 can be defined as a back side illumination (BSI) image sensor.

The interlayer insulating layer 120 may be laminated on a front side FRONT of the semiconductor substrate 110. Generally, each of the unit pixels may include the photodiode 112 (that transforms the light to electric charges and that accumulates the electric charges) and a signal generating circuit (that generates an electric signal corresponding to the accumulated electric charges). Here, the interlayer insulating layer 120 may include gate terminals of transistors (not illustrated) composing the signal generating circuit, and multi-layer conductive lines. In a CMOS image sensor, for example, the interlayer insulating layer 120 may include gates of transfer transistors, gates of reset transistors, gates of source follower transistors, gates of select transistors, and gates of bias transistors. In addition, the multi-layer conductive lines may be electrically connected among themselves or to such gates by a contact or a plug. According to some example embodiments, the anti-reflective layer (not illustrated) may be laminated between the front side FRONT of the semiconductor substrate 110 and the interlayer insulating layer 120. The anti-reflective layer laminated between the front side FRONT of the semiconductor substrate 110 and the interlayer insulating layer 120 may prevent light passing through a target unit pixel (i.e., a unit pixel below the micro lens and color filter through which the light passes) from being captured by peripheral unit pixels after being reflected by the interlayer insulating layer 120.

The light path converters 130 may be formed among or between the color filters 140. For example, the light patch converters 130 may be disposed adjacent to at least one color filter. The light path converters 130 may be formed in a sloped shape or with slanted side edges. In some example embodiments, the light path converters 130 may be refractive bodies 130 that refract incident light or light diffracted by the micro lenses 150. According to an embodiment, a refractive index of the refractive bodies 130 may be less than a refractive index of the color filters 140. As such, a refraction angle of the light may be greater than an incidence angle of the light. Further, the incident light or the light diffracted by the micro lenses 150 may be refracted by the refractive bodies 130. Thus, light that would otherwise be directed toward the peripheral unit pixel may be turned toward the target unit pixel. In an exemplary embodiment, the refractive bodies 130 may have a triangular cross section or a trapezoidal cross section. The refractive bodies 130 having the trapezoidal cross section are illustrated in FIG. 1. The refractive bodies 130 may be formed by laminating a refractive layer (e.g., a layer including calcium fluoride ($CaF_2$), magnesium fluoride ($MaF_2$), etc) on the back side BACK of the semiconductor substrate 110, and by etching (e.g., over-etching, slope-etching, etc.) the laminated refractive layer with a mask. The shape of the refractive bodies 130 may be configured in the etching process by controlling a process time and a concentration of etching solution. A slope angle of the refractive bodies 130 having the triangular or trapezoidal cross section may facilitate refraction of light incident to the refractive bodies 130 to thereby illuminate the target unit pixels.

In an implementation, the slope angle may refer to an interior angle between a horizontal bottom edge and a slanted side edge of the triangular or trapezoidal refractive bodies 130. According to an embodiment, the slope angle may be less than 90°.

The color filters 140 may be laminated on the back side BACK of the semiconductor substrate 110, and may be formed above the unit pixels of the semiconductor substrate 110. In some example embodiments, a Bayer pattern technique may be employed in the color filters 140. For example, the color filters 140 may include at least one red filter, at least one green filter, and at least one blue filter, or may include at least one yellow filter, at least one magenta filter, and at least one cyan filter. According to some example embodiments, a flat layer (i.e., an over-coating layer) may be coated on the color filters 140. The micro lenses 150 may be laminated on the color filters 140, thereby guiding incident light to the photodiode 112 of the unit pixel.

Furthermore, the unit pixel array 100 of an image sensor may further include an anti-reflective layer 160 that is laminated between a back side BACK of the semiconductor substrate 110 and the color filters 140. The anti-reflective layer 160 may prevent incident light entering through the micro lenses 150 and the color filters 140 from reflecting on the back side BACK of the semiconductor substrate 110. The anti-reflective layer 160 may also prevent incident light that is refracted by the refractive bodies 130 from reflecting on the back side BACK of the semiconductor substrate 110. Thus, incident light may efficiently penetrate the anti-reflective layer 160 such that sensing efficiency (e.g., light-receiving efficiency and photo sensitivity) may be improved. In an exemplary embodiment, the anti-reflective layer 160 may be formed by alternately laminating materials having different refractive indices. A higher light transmittance of the anti-reflective layer 160 may be achieved with increased lamination of such materials.

In order to improve the sensing efficiency (e.g., light-receiving efficiency and photo sensitivity), a ratio of light-receiving area to a whole area of an image sensor, i.e., a fill factor, should be high. However, there may be a fundamental limitation with respect to increasing the fill factor because a logic circuit may occupy a considerable area of the image sensor. The unit pixel array 100 of an image sensor may have the light path converter 130 among the color filters 140 to improve the sensing efficiency. Accordingly, the incident light or the light being diffracted by the micro lenses 150 may be captured by only target unit pixels (i.e., not by peripheral unit pixels) such that an undesirable optical crosstalk may be efficiently prevented. Further, the image sensor including the unit pixel array 100 of FIG. 1 may have high sensing efficiency (e.g., light-receiving efficiency and photo sensitivity) without increasing the fill factor, and may generate high-quality images. Since a structure of the unit pixel array 100 illustrated in FIG. 1 is an exemplary embodiment, the structure of the unit pixel array 100 is not limited thereto. For example, the unit pixel array 100 of an image sensor may be employed to a front side illumination image sensor.

FIGS. 2A through 2G illustrate cross-sectional views of stages in a method of manufacturing the unit pixel array of FIG. 1.

Figure 2A:
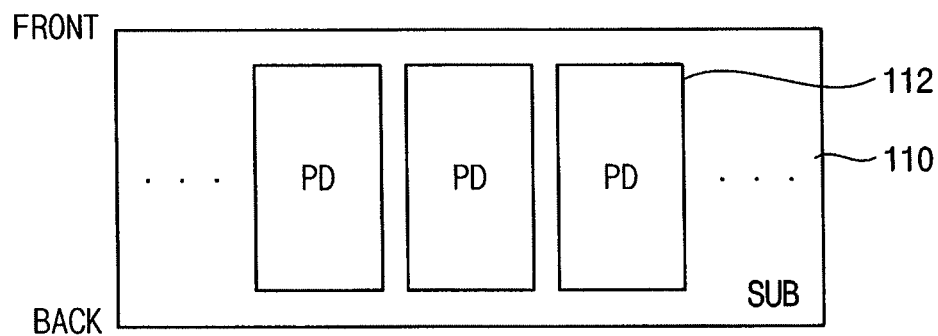
FIGS. 2A through 2G illustrate cross-sectional views of stages in a method of manufacturing the unit pixel array of FIG. 1.

Referring to FIG. 2A, the unit pixels including the photodiode 112 may be formed in the semiconductor substrate 110. In an exemplary embodiment, the semiconductor substrate 110 may be the (p)-type epitaxial substrate. For example, the semiconductor substrate 110 may be manufactured by forming a (p)-type epitaxial layer on a (p)-type bulk silicon substrate. Each of the unit pixels may transform light to electric charges, accumulate the electric charges, and generate electric signals corresponding to the accumulated electric charges. For these operations, each of the unit pixels may include the photodiode 112 and a plurality of transistors (not illustrated). Each of the unit pixels may have, e.g., a one-transistor structure, a three-transistor structure, a four-transistor structure, or a five-transistor structure. In a CMOS image sensor, for example, when each of the unit pixels has a five-transistor structure, each of the unit pixels may include a reset transistor, a source follower transistor, a select transistor, a transfer transistor, and a bias transistor. Hereinafter, the plurality of transistors will not be described for convenience of description.

In the semiconductor substrate 110, the unit pixels including the photodiode 112 may be arranged in a matrix form. The photodiode 112 may be formed by performing an ion-implantation process. In an exemplary embodiment, the photodiode 112 may be an (n)-type region formed in the (p)-type epitaxial layer of the semiconductor substrate 110. According to some example embodiments, the photodiode 112 may be formed by laminating a plurality of doping regions. The upper doping region may be formed by implanting (n+)-type ions in the (p)-type epitaxial layer of the semiconductor substrate 110, and the lower doping region may be formed by implanting (n−)-type ions in the (p)-type epitaxial layer of the semiconductor substrate 110. The element isolation regions may be formed using a field oxide (FOX) by a shallow trench isolation (STI) process or a local oxidation of silicon (LOCOS) process.

Figure 2B:
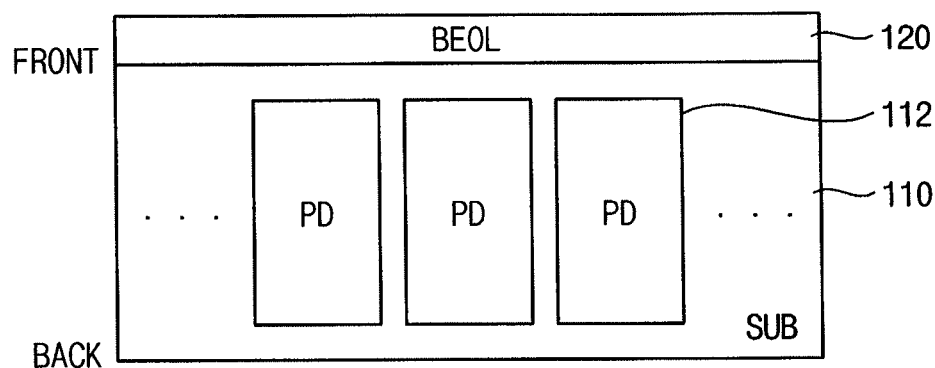

Referring to FIG. 2B, the interlayer insulating layer 120 may be formed on the front side FRONT of the semiconductor substrate 110. Generally, each of the unit pixels may include the photodiode 112 (that transforms the light to electric charges, and that accumulates the electric charges), and a signal generating circuit (that generates an electric signal corresponding to the accumulated electric charges). The interlayer insulating layer 120 may include gate terminals of transistors (not illustrated), including the signal generating circuit, and multi-layer conductive lines. The interlayer insulating layer 120 may be formed of a material having good gap-fill characteristics. For example, the material having good gap-fill characteristics may be a high density plasma (HDP), a tonen silazene (TOSZ), a spin on glass (SOG), an undoped silica glass (USG), or combinations thereof. In an exemplary embodiment, the gate terminals in the interlayer insulating layer 120 may be formed by laminating a gate insulation layer and a gate conductive layer on the front side FRONT of the semiconductor substrate 110, and by patterning the gate insulation layer and the gate conductive layer laminated on the front side FRONT of the semiconductor substrate 110. The multi-layer conductive lines in the interlayer insulating layer 120 may be formed by patterning a conductive material having a metal, such as copper, aluminum, etc. The gate insulation layer may be formed of silicon oxide ($SiO_x$), silicon oxynitride ($SiO_xN_y$), silicon nitride ($SiN_x$), germanium oxynitride ($GeO_xN_y$), germanium silicon oxide ($GeSi_xO_y$), or a material having a high dielectric constant, such as hafnium oxide ($HfO_x$), zirconium oxide ($ZrO_x$), aluminum oxide ($AlO_x$), tantalum oxide ($TaO_x$), hafnium silicate ($HfSi_x$), zirconium silicate ($ZrSi_x$), or combinations thereof. The gate conductive layer may be formed by depositing a polysilicon layer on the front side FRONT of the semiconductor substrate 110. In an exemplary embodiment, the protective layer (not illustrated) for protecting elements may be formed on the interlayer insulating layer 120.

Figure 2C:
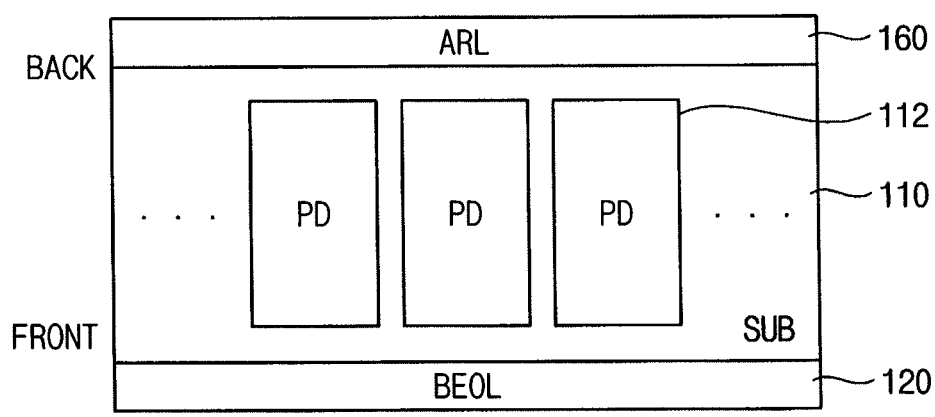

Referring to FIG. 2C, the semiconductor substrate 110 may be formed by performing a grinding process on the back side BACK of the semiconductor substrate 110. The grinding process may be performed by using a mechanical and/or a chemical planarization process. For example, the mechanical planarization process may be performed by rubbing the back side BACK of the semiconductor substrate 110 with a polishing pad. The chemical planarization process may be performed by using a chemical material, such as a chemical slurry, in conjunction with the polishing pad. For example, the chemical slurry may be provided between the polishing pad and the back side BACK of the semiconductor substrate 110. In an implementation, a chemical-mechanical polishing process may be performed. After performing the grinding process on the back side BACK of the semiconductor substrate 110, a (p)-type impurities region (not illustrated) may be formed on the back side BACK of the semiconductor substrate 110. The (p)-type impurities region may passivate surface defects such as a dangling bond. Subsequently, the anti-reflective layer 160 may be formed on the semiconductor substrate 110. As described above, the anti-reflective layer 160 may be formed by alternately laminating materials having different refractive indices. With increased lamination of such materials, a higher light transmittance of the anti-reflective layer 160 may be achieved. According to some example embodiments, however, the process of forming the (p)-type impurities region (not illustrated) and the anti-reflective layer 160 may be omitted.

Figure 2D:
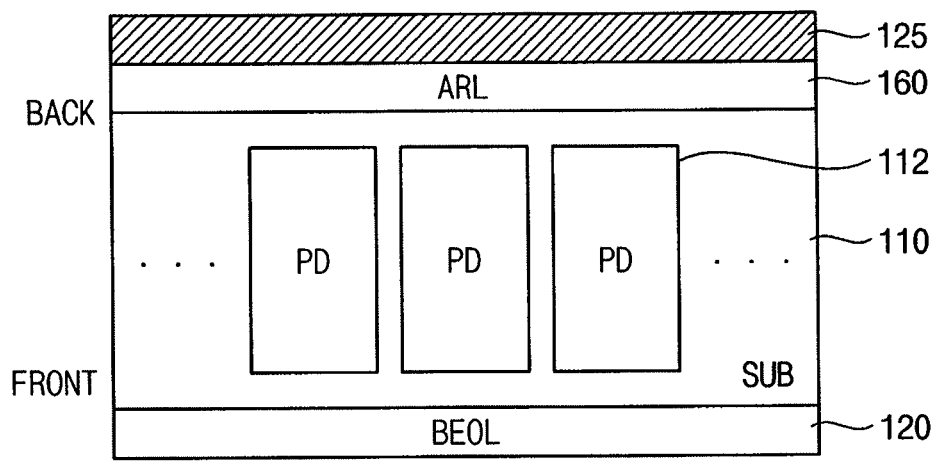
Figure 2E:
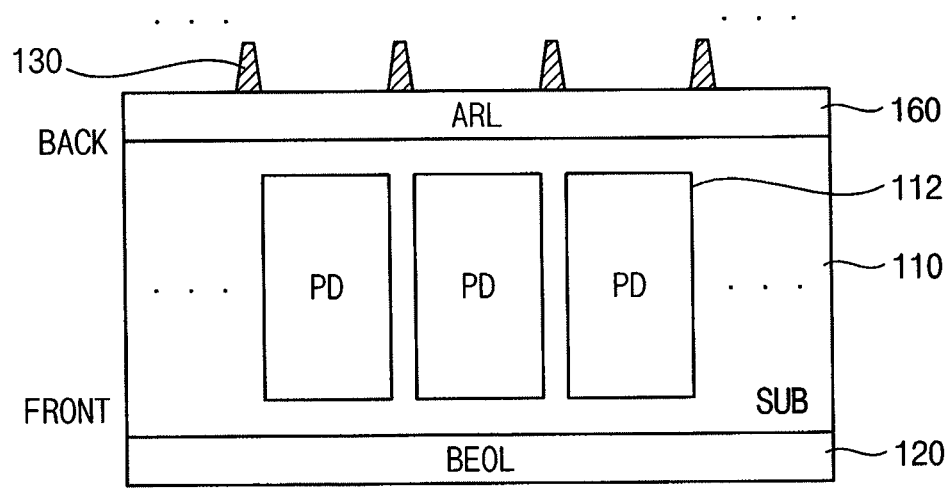

Referring to FIGS. 2D and 2E, the light path converters 130 (corresponding to the refractive bodies 130) may be formed by laminating a refractive layer 125 on the back side BACK of the semiconductor substrate 110, and by etching (e.g., over-etching, slope-etching, etc) the laminated refractive layer 125 with a mask. Here, the light path converters 130 may be formed in a sloped shape, for example, a polygonal shape with slanted side edges. The shape may be determined in the etching process by controlling a process time and a concentration of etching solution. In an exemplary embodiment, the light path converters 130 may have a triangular cross section or a trapezoidal cross section. A slope angle of the triangular light path converters 130 (i.e., an interior angle between a horizontal bottom edge and a slanted side edge) or a slope angle of the trapezoidal light path converters 130 (i.e., an interior angle between a horizontal bottom edge and a slanted side edge) may facilitate refraction of incident light by the light path converters 130 to thereby illuminate the target unit pixels.

The light path converters 130 having the trapezoidal cross section are illustrated in FIGS. 2D and 2E. A refractive index of the light path converters 130 may be less than a refractive index of the color filters 140. As such, a refraction angle of the light may be greater than an incidence angle of the light. Also, the incident light or the light being diffracted by the micro lens 150 may be refracted by the light path converter 130. Thus, light that would otherwise be directed toward the peripheral unit pixel may be turned toward the target unit pixel.

Figure 2F:
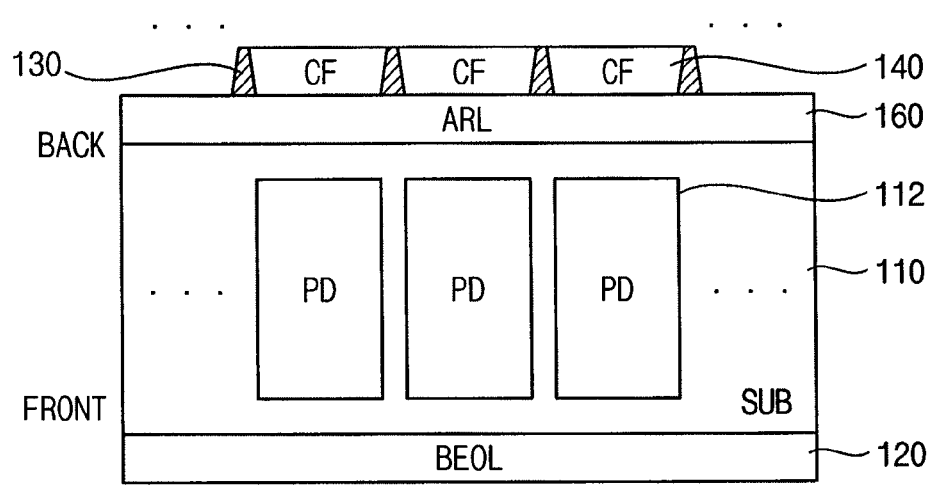

Referring to FIG. 2F, the color filters 140 may be laminated on the back side BACK of the semiconductor substrate 110, and may be formed above the unit pixels of the semiconductor substrate 110. The color filters 140 may be formed by coating the back side BACK of the semiconductor substrate 110 with a photosensitive material (e.g., a photo-resist), and by patterning the photosensitive material (e.g., performing the photolithography and lithography process using masks). Each color filter 140 may be formed between adjacent light path converters 130. Thus, the color filters 140 may have sloped or slanted side edges. As shown in FIG. 2F, the light path converters 130 may have a trapezoidal cross section with a horizontal bottom edge that is longer than an opposing, horizontal top edge. The color filters 140 may have a reversed trapezoidal cross section with a horizontal bottom edge that is shorter than an opposing horizontal top edge. In an exemplary embodiment, a Bayer pattern technique may be employed in the color filters 140. For example, the color filters 140 may include at least one red filter, at least one green filter, and at least one blue filter, or may include at least one yellow filter, at least one magenta filter, and at least one cyan filter. According to some example embodiments, a flat layer (i.e., an overcoating layer) may be coated on the color filters 140.

Figure 2G:
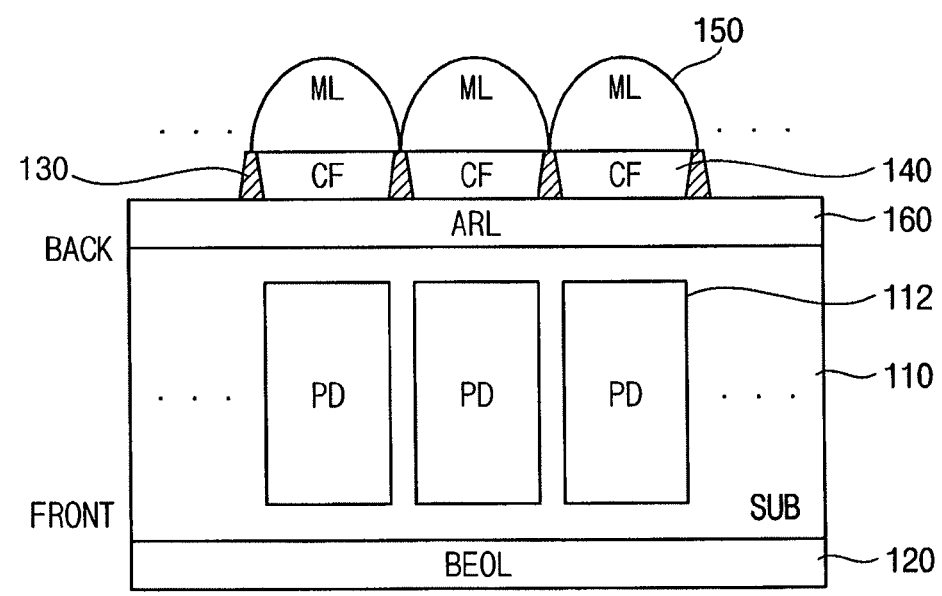

Referring to FIG. 2G, the micro lenses 150 may be laminated on the color filters 140, to facilitate guiding of incident light to the photodiode 112 of the unit pixel. The micro lenses 150 may be formed by generating a plurality of patterns using a beam penetration photo-resist, and by performing a reflow process for the plurality of patterns. Since the manufacturing process of the unit pixel array 100 illustrated in FIGS. 2A through 2F is only an exemplary embodiment, the manufacturing process of the unit pixel array 100 is not limited thereto. As described above, in the unit pixel array 100 of FIG. 1, the light path converters 130 may be disposed among the color filters 140 to, for example, improve the sensing efficiency. For example, each light path converter may be disposed adjacent to at least one color filter 140. Accordingly, the light diffracted by the micro lenses 150 may be captured by only target unit pixels (i.e., not by peripheral unit pixels) such that an undesirable optical crosstalk may be efficiently prevented. Further, the image sensor including the unit pixel array 100 of FIG. 1 may have high sensing efficiency (e.g., light-receiving efficiency and photo sensitivity) without increasing the fill factor, and may generate high-quality images.

Figure 3:
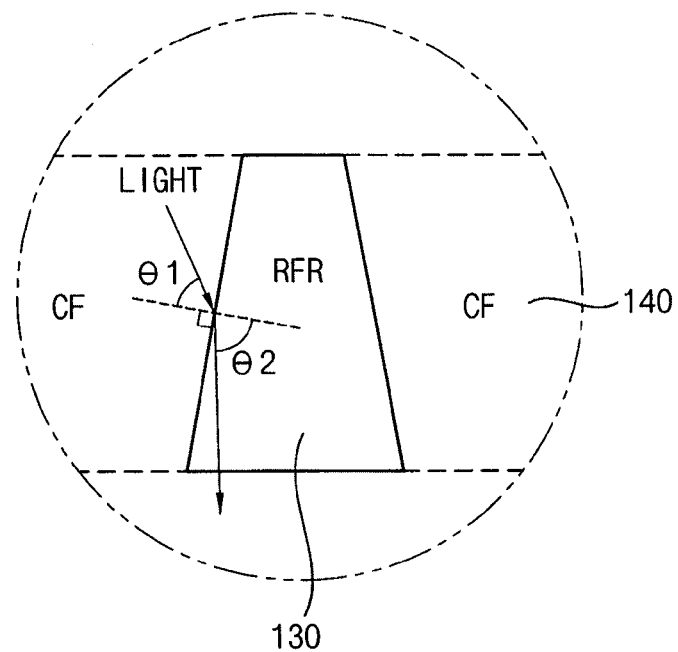
FIG. 3 illustrates a diagram of a portion of the unit pixel array of FIG. 1 in which incident light is refracted by a light path converter.

FIG. 3 illustrates a diagram of a portion of the unit pixel array of FIG. 1 in which incident light is refracted by a light path converter.

Referring to FIG. 3, each light path converter 130 may have a sloped shape or slanted side edges, and may be disposed between adjacent color filters 140. Also, a refractive index of the light path converters 130 may be less than a refractive index of the color filters 140. Thus, when the incident light illuminates on the light path converters 130 after passing through the color filters 140, a refraction angle $\theta 2$ of the light may be greater than an incidence angle $\theta 1$ of the light.

According to Snell's law, '$n1 \sin(\theta 1) = n2 \sin(\theta 2)$' is established when the refractive index of the color filters 140 is n1 and the refractive index of the light path converters 130 is n2. Consequently, the incident light or the light diffracted by the micro lens 150 may be refracted by the light path converter 130; and the light directed toward the peripheral unit pixel may be turned toward the target unit pixel. In an exemplary embodiment, the light path converters 130 may have a triangular cross section or a trapezoidal cross section. A slope angle of the light path converters 130 having the triangular cross section (i.e., an interior angle between a horizontal bottom edge and a slanted side edge) or a slope angle of the light path converters 130 having the trapezoidal cross section (i.e., an interior angle between a horizontal bottom edge and a slanted side edge) may facilitate refraction of light incident to the refractive bodies 130 to thereby illuminate the target unit pixels. Although the light path converters 130 may are shown with the trapezoidal cross section shown in FIG. 3, a cross section of the light path converters 130 is not limited thereto. For example, the cross section of the light path converter 130 may be any polygon having a sloped shape or slanted edges.

Figure 4:
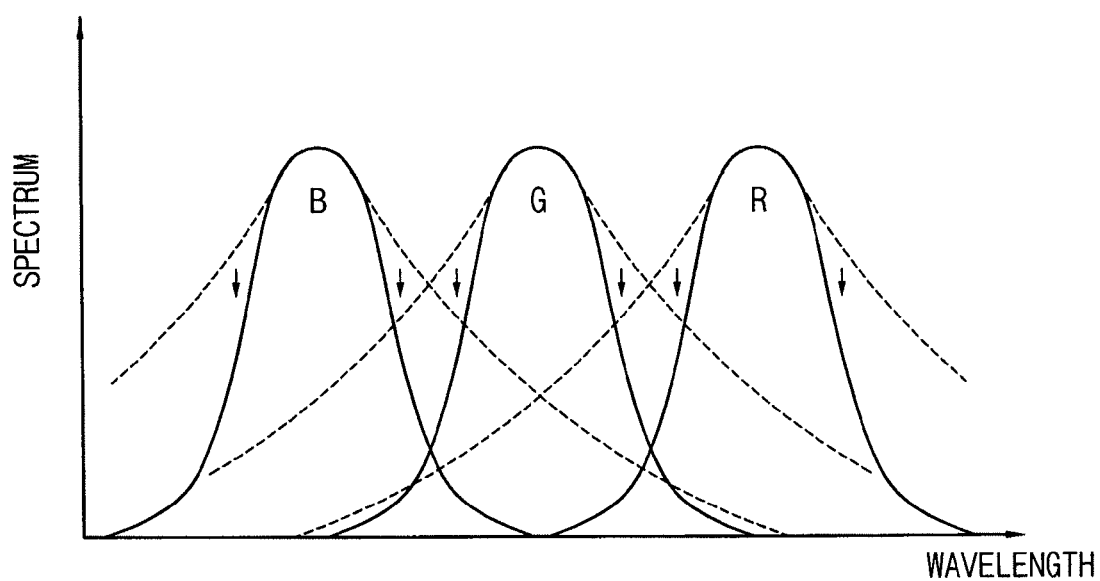
FIG. 4 illustrates a graph of spectral characteristics of an image sensor having a unit pixel array of FIG. 1.

FIG. 4 illustrates a graph of spectral characteristics of an image sensor having a unit pixel array of FIG. 1.

Referring to FIG. 4, the spectral characteristics of conventional image sensors are indicated by dashed lines, and the spectral characteristics of the image sensor having the unit pixel array of FIG. 1 are indicated by solid lines. As illustrated in FIG. 4, the spectral characteristics of the image sensor having the unit pixel array of FIG. 1 may be better than the spectral characteristics of conventional image sensors.

The color filters 140 may include at least one red filter, at least one green filter, and at least one blue filter. The color filters 140 may have different transmittances according to types of the color filters 140 (e.g., the blue filter B, the green filter G, and the red filter R). Thus, the blue filter B allows the blue light having a short wavelength to pass through, the green filter G allows the green light having a middle wavelength to pass through, and the red filter R allows the red light having a long wavelength to pass through. If the Bayer pattern technique is employed in the color filters 140, the red filter R, the green filter G, and the blue filter B may be formed above adjacent unit pixels. In conventional image sensors, the incident light may be captured by not only photodiodes of target unit pixels, but also photodiodes of peripheral unit pixels. Thus, the conventional image sensors may not prevent undesirable optical crosstalk and may result in poor spectral characteristics. On the other hand, in the image sensor having the unit pixel array 100 of FIG. 1, the incident light may be captured by only photodiodes of the target unit pixels. Thus, the image sensor having the unit pixel array 100 of FIG. 1 may prevent the undesirable optical crosstalk, resulting in improved spectral characteristics. Further, the image sensor having the unit pixel array 100 of FIG. 1 may have high sensing efficiency (e.g., light-receiving efficiency and photo sensitivity) without increasing the fill factor, and may generate high-quality images.

Figure 5:
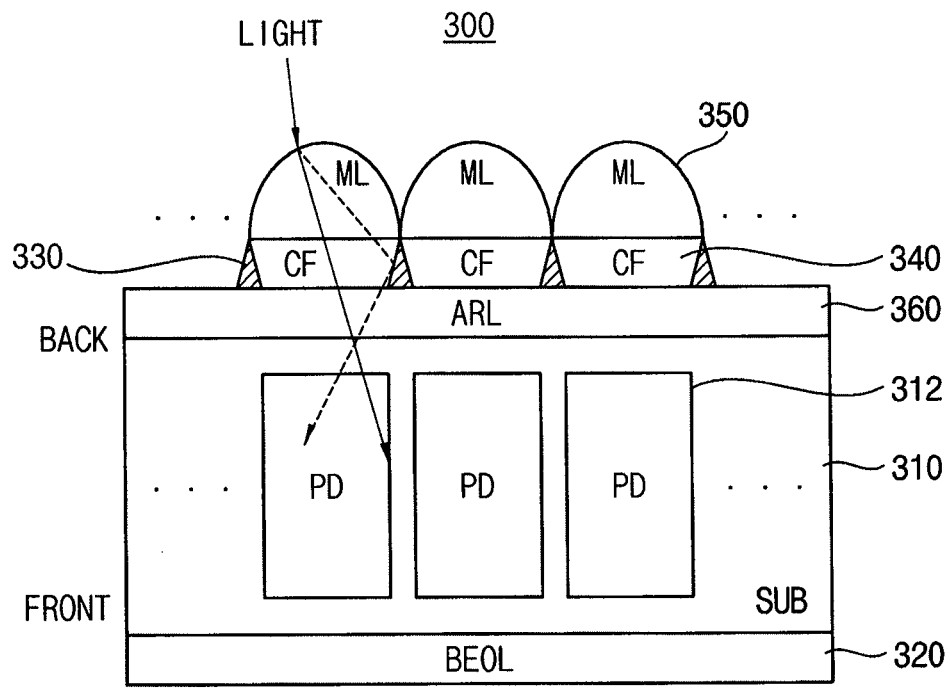
FIG. 5 illustrates a diagram of a unit pixel array of an image sensor according to some example embodiments.

FIG. 5 illustrates a diagram of a unit pixel array of an image sensor according to some example embodiments.

Referring to FIG. 5, the unit pixel array 300 of an image sensor may include a semiconductor substrate 310, an interlayer insulating layer 320, light path converters 330, color filters 340, and micro lenses 350. According to some example embodiments, the unit pixel array 300 of an image sensor may further include an anti-reflective layer 360 that is laminated between a back side BACK of the semiconductor substrate 310 and the color filters 340, and an anti-reflective layer 36 that is laminated between a front side FRONT of the semiconductor substrate 310 and the interlayer insulating layer 320.

The semiconductor substrate 310 may include a plurality of unit pixels for capturing incident light. For convenience of description, the unit pixels are illustrated only as a photodiode 312 corresponding to a photo sensing device in FIG. 5. According to some example embodiments, the photo sensing device may be, for example, a photodiode, a photo transistor, a photo gate, a pinned photodiode, or a combination thereof. The semiconductor substrate 310 may be a (p)-type epitaxial substrate. Here, the photodiode 312 may be formed by implanting (n)-type ions into the semiconductor substrate 310. In the unit pixel array 300 of an image sensor, the unit pixels may be arranged in a matrix form. As illustrated in FIG. 5, the light may illuminate through the back side BACK of the semiconductor substrate 310 after passing through the micro lenses 350 and the color filters 340. Thus, an image sensor having the unit pixel array 300 of FIG. 5 may be defined as a back side illumination (BSI) image sensor.

The interlayer insulating layer 320 may be laminated on a front side FRONT of the semiconductor substrate 310. Generally, each of the unit pixels may include the photodiode 312 (that transforms the light to electric charges and that accumulates the electric charges) and a signal generating circuit (that generates an electric signal corresponding to the accumulated electric charges). Here, the interlayer insulating layer 320 may include gate terminals of transistors (not illustrated) including the signal generating circuit, and multi-layer conductive lines. In a CMOS image sensor, for example, the interlayer insulating layer 320 may include gates of transfer transistors, gates of reset transistors, gates of source follower transistors, gates of select transistors, and gates of bias transistors. In addition, the multi-layer conductive lines may be electrically connected among themselves or to such gates by a contact or a plug. According to some example embodiments, the anti-reflective layer (not illustrated) may be laminated between the front side FRONT of the semiconductor substrate 310 and the interlayer insulating layer 320. The anti-reflective layer laminated between the front side FRONT of the semiconductor substrate 310 and the interlayer insulating layer 320 may prevent light that passes through a target unit pixel (i.e., a unit pixel below the micro lens and color filter through which the light passes) from being captured by peripheral unit pixels after being reflected by the interlayer insulating layer 320.

The light path converters 330 may include sloped or slanted side edges and may be disposed among or between the color filters 340. In some example embodiments, the light path converters 330 may be reflective bodies 330 that reflect incident light or light diffracted by the micro lenses 350. Here, an incidence angle of the light and a reflection angle of the light may be substantially the same on a surface of the reflective bodies 330. Consequently, the incident light or the light diffracted by the micro lenses 350 may be reflected by the reflective bodies 330. Thus, light that would otherwise be directed toward the peripheral unit pixel may be turned toward the target unit pixel. According to some example embodiments, the incidence angle of the light and the reflection angle of the light on the surface of the reflective bodies 330 may be different. In some example embodiments, the reflective bodies 330 may be formed of silicon (Si), titanium (Ti), titanium nitride (TiN), aluminum (Al), copper (Cu), tungsten (W), or combinations thereof, and may have a triangular cross section or a trapezoidal cross section. The reflective bodies 330 having the triangular cross section are illustrated in FIG. 5. The reflective bodies 330 may be formed by metalizing a material layer (e.g., a silicon layer or a metal layer) on the back side BACK of the semiconductor substrate 310, and by patterning the metalized material layer with a mask. A slope angle of the reflective bodies 330 having the triangular or trapezoidal cross section may facilitate reflection of incident light from the reflective bodies 330 to thereby illuminate the target unit pixels.

The color filters 340 may be laminated on the back side BACK of the semiconductor substrate 310, and may be formed above the unit pixels of the semiconductor substrate 310. In some example embodiments, a Bayer pattern technique may be employed in the color filters 340. For example, the color filters 340 may include at least one red filter, at least one green filter, and at least one blue filter, or may include at least one yellow filter, at least one magenta filter, and at least one cyan filter. According to some example embodiments, a flat layer (i.e., an over-coating layer) may be coated on the color filters 340. The micro lenses 350 may be laminated on the color filters 340 to facilitate guiding of incident light to the photodiode 312 of the unit pixel.

Furthermore, the unit pixel array 300 of an image sensor may further include an anti-reflective layer 360 that is laminated between a back side BACK of the semiconductor substrate 310 and the color filters 340. The anti-reflective layer 360 may prevent incident light entering through the micro lenses 350 and the color filters 340 from reflecting toward the back side BACK of the semiconductor substrate 310. The anti-reflective layer 360 may also prevent incident light reflected by the reflective bodies 330 from reflecting toward the back side BACK of the semiconductor substrate 310. Thus, such incident light may efficiently penetrate the anti-reflective layer 360 such that sensing efficiency (e.g., light-receiving efficiency and photo sensitivity) may be improved. In an exemplary embodiment, the anti-reflective layer 360 may be formed by alternately laminating materials having different refractive indices. Increased lamination of such materials may help to achieve higher light transmittance of the anti-reflective layer 360.

As described above, sensing efficiency may be improved by disposing the light path converters 330 among or between the color filters 340. Accordingly, the incident light or the light diffracted by the micro lenses 350 may be captured by only target unit pixels (i.e., not by peripheral unit pixels) such that an undesirable optical crosstalk may be efficiently prevented. Further, the image sensor including the unit pixel array 300 of FIG. 5 may have high sensing efficiency (e.g., light-receiving efficiency and photo sensitivity) without increasing the fill factor, and may generate high-quality images. Since a structure of the unit pixel array 300 illustrated in FIG. 5 is only an exemplary embodiment, the structure of the unit pixel array 300 is not limited thereto. For example, the unit pixel array 300 of an image sensor may be employed to a front side illumination image sensor.

FIGS. 6A through 6G illustrate cross-sectional views of stages in a method of manufacturing a unit pixel array of FIG. 5.

Figure 6A:
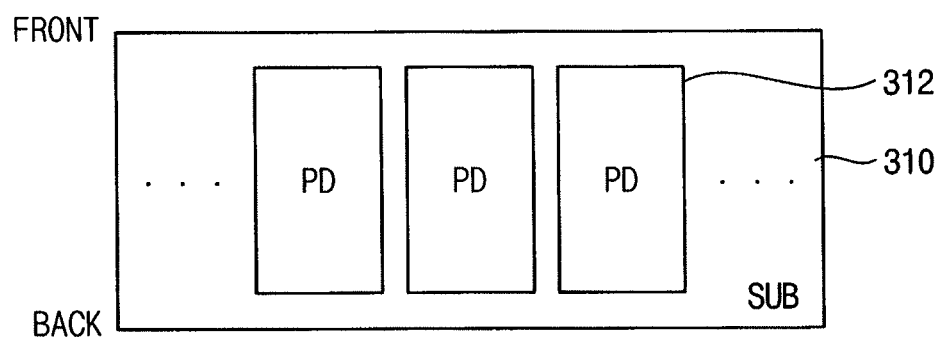
FIGS. 6A through 6G illustrate cross-sectional views of stages in a method of manufacturing the unit pixel array of FIG. 5.

Referring to FIG. 6A, the unit pixels including the photodiode 312 may be formed in the semiconductor substrate 310. In an exemplary embodiment, the semiconductor substrate 310 may be the (p)-type epitaxial substrate. For example, the semiconductor substrate 310 may be manufactured by forming a (p)-type epitaxial layer on a (p)-type bulk silicon substrate. Each of the unit pixels may transform the light to electric charges, accumulate the electric charges, and generate the electric signal corresponding to the accumulated electric charges. In the semiconductor substrate 310, the unit pixels including the photodiode 312 may be arranged in the matrix form. The photodiode 312 may be formed by performing an ion-implantation process. In an exemplary embodiment, the photodiode 312 may be an (n)-type region formed in the (p)-type epitaxial layer of the semiconductor substrate 310. According to some example embodiments, the photodiode 312 may be formed by laminating a plurality of doping regions. Here, the upper doping region may be formed by implanting (n+)-type ions in the (p)-type epitaxial layer of the semiconductor substrate 310, and the lower doping region may be formed by implanting (n−)-type ions in the (p)-type epitaxial layer of the semiconductor substrate 310. The element isolation regions may be formed using a field oxide (FOX) by a shallow trench isolation (STI) process or a local oxidation of silicon (LOCOS) process.

Figure 6B:
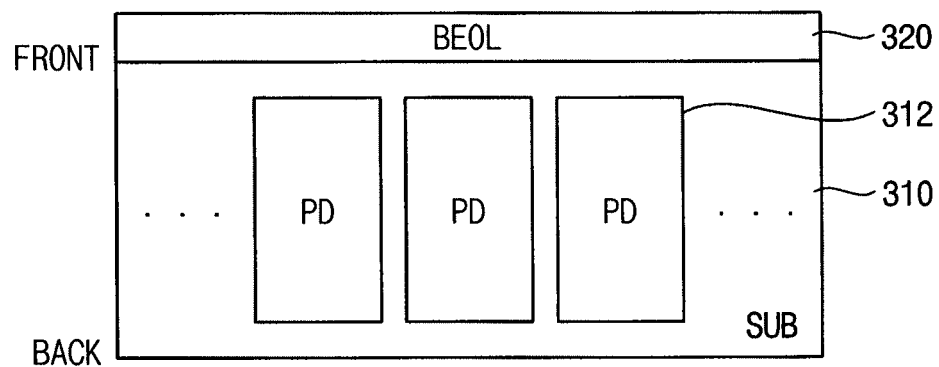

Referring to FIG. 6B, the interlayer insulating layer 320 may be formed on the front side FRONT of the semiconductor substrate 310. Generally, each of the unit pixels may include the photodiode 312 (that transforms the light to electric charges and accumulates the electric charges) and a signal generating circuit (that generates an electric signal corresponding to the accumulated electric charges). Here, the interlayer insulating layer 320 may have gate terminals of transistors (not illustrated) including the signal generating circuit, and multi-layer conductive lines. The interlayer insulating layer 320 may be formed by a material having good gap-fill characteristics. For example, the material having good gap-fill characteristics may be a high density plasma (HDP), a tonen silazene (TOSZ), a spin on glass (SOG), an undoped silica glass (USG), or combinations thereof. In an exemplary embodiment, the gate terminals in the interlayer insulating layer 320 may be formed by laminating a gate insulation layer and a gate conductive layer on the front side FRONT of the semiconductor substrate 310, and by patterning the gate insulation layer and the gate conductive layer laminated on the front side FRONT of the semiconductor substrate 310. The multi-layer conductive lines in the interlayer insulating layer 320 may be formed by patterning a conductive material having a metal such as copper, aluminum, etc. The gate insulation layer may be formed of silicon oxide ($SiO_x$), silicon oxynitride ($SiO_xN_y$), silicon nitride ($SiN_x$), germanium oxynitride ($GeO_xN_y$), germanium silicon oxide ($GeSi_xO_y$), or a material having a high dielectric constant, such as hafnium oxide ($HfO_x$), zirconium oxide ($ZrO_x$), aluminum oxide ($AlO_x$), tantalum oxide ($TaO_x$), hafnium silicate ($HfSi_x$), zirconium silicate ($ZrSi_x$), or a combination thereof. The gate conductive layer may be formed by depositing a polysilicon layer. In an exemplary embodiment, the protective layer (not illustrated) for protecting elements may be formed on the interlayer insulating layer 320.

Figure 6C:
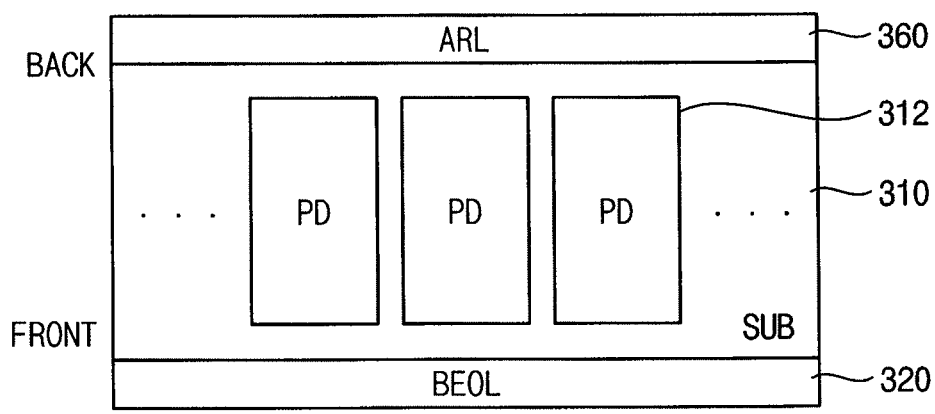

Referring to FIG. 6C, the semiconductor substrate 310 may be formed by performing a grinding process on the back side BACK of the semiconductor substrate 310. The grinding process may be performed by using a mechanical and/or a chemical planarization process. In an implementation, a chemical-mechanical polishing process may be performed. For example, the mechanical planarization process may be performed by rubbing the back side BACK of the semiconductor substrate 310 with a polishing pad. The chemical planarization process may be performed by using a chemical material, such as a chemical slurry, in conjunction with the polishing pad. For example, the chemical planarization process may be performed by providing a chemical slurry between the polishing pad and the back side BACK of the semiconductor substrate 310. After performing the grinding process on the back side BACK of the semiconductor substrate 310, a (p)-type impurities region (not illustrated) may be formed on the back side BACK of the semiconductor substrate 310. The (p)-type impurities region may passivate surface defects, such as a dangling bond. Subsequently, the anti-reflective layer 360 may be formed on the semiconductor substrate 310. As described above, the anti-reflective layer 360 may be formed by alternately laminating materials having different refractive indexes. A higher light transmittance of the anti-reflective layer 360 may be achieved with increased lamination of such materials. According to some example embodiments, however, the process of forming the (p)-type impurities region (not illustrated) and the anti-reflective layer 360 may be omitted.

Figure 6D:
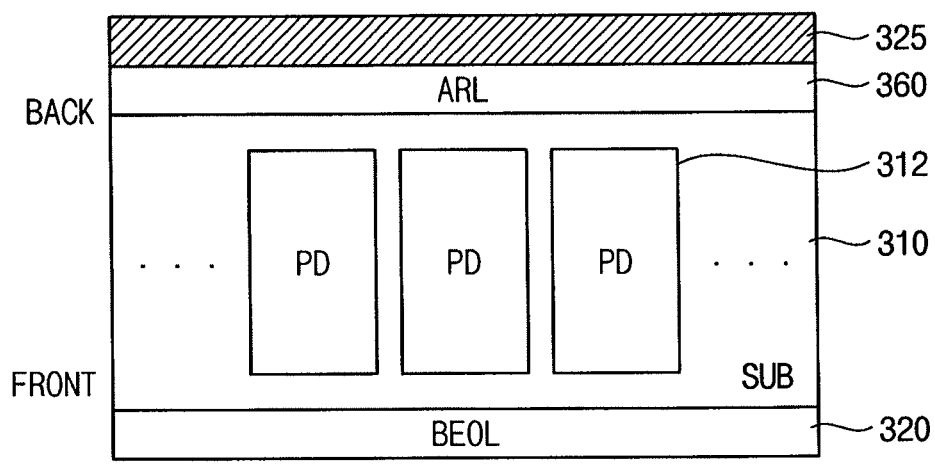
Figure 6E:
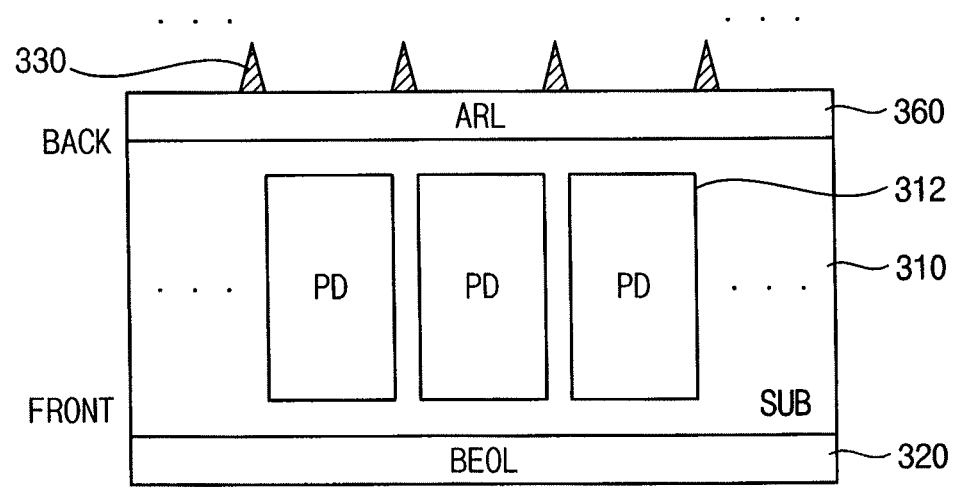

Referring to FIGS. 6D and 6E, the light path converters 330 corresponding to the reflective bodies 330 may be formed by metalizing a material layer (e.g., applying a silicon layer or metal layer 325) on the back side BACK of the semiconductor substrate 310, and by patterning the metalized material layer 325 with a mask. For example, the material layer 325 may be formed of silicon (Si), titanium (Ti), titanium nitride (TiN), aluminum (Al), copper (Cu), tungsten (W), or combinations thereof. Here, the light path converters 330 may have a sloped shape or slanted side edges; and the shape may be determined in the process of patterning the metalized material layer 325. In an exemplary embodiment, the light path converters 330 may have a triangular cross section or a trapezoidal cross section. A slope angle of the light path converters 330 having the triangular cross section (i.e., an interior angle between a base or horizontal bottom edge and a diagonal or slanted side edge) or a slope angle of the light path converters 330 having the trapezoidal cross section (i.e., an interior angle between a base or horizontal bottom edge and a slanted side edge) may facilitate reflection of incident light from the light path converters 330 to thereby illuminate the target unit pixels. Consequently, the incident light or the light diffracted by the micro lenses 350 may be reflected from the reflective bodies 330. Thus, light that would otherwise be directed toward the peripheral unit pixel may be turned toward the target unit pixel. The light path converters 330 having the triangular cross section are illustrated in FIGS. 6D and 6E.

Figure 6F:
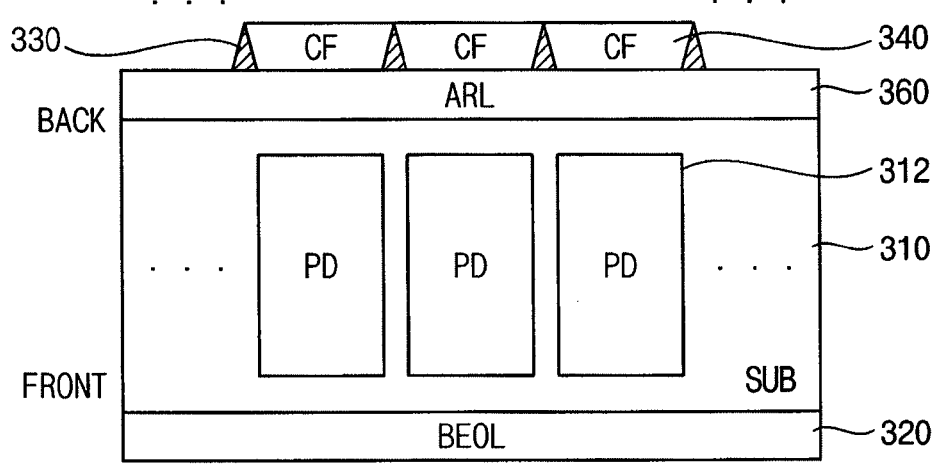

Referring to FIG. 6F, the color filters 340 may be laminated on the back side BACK of the semiconductor substrate 310, and may be formed above the unit pixels of the semiconductor substrate 310. The color filters 340 may be formed by coating the back side BACK of the semiconductor substrate 310 with a photosensitive material (e.g., a photo-resist), and by patterning the photosensitive material (e.g., performing the photolithography and lithography process using masks). Each color filter 340 may be formed between adjacent light path converters 330. As such, the color filters 340 may have sloped or slanted side edges. In FIG. 6F, the light path converters 330 may have a triangular cross section. Thus, the color filters 340 may have a reversed trapezoidal cross section whose base or bottom edge is shorter than an opposing top edge. In an exemplary embodiment, a Bayer pattern technique may be employed in the color filters 340. For example, the color filters 340 may include at least one red filter, at least one green filter, and at least one blue filter, or may include at least one yellow filter, at least one magenta filter, and at least one cyan filter. According to some example embodiments, a flat layer (i.e., an over-coating layer) may be coated on the color filters 340.

Figure 6G:
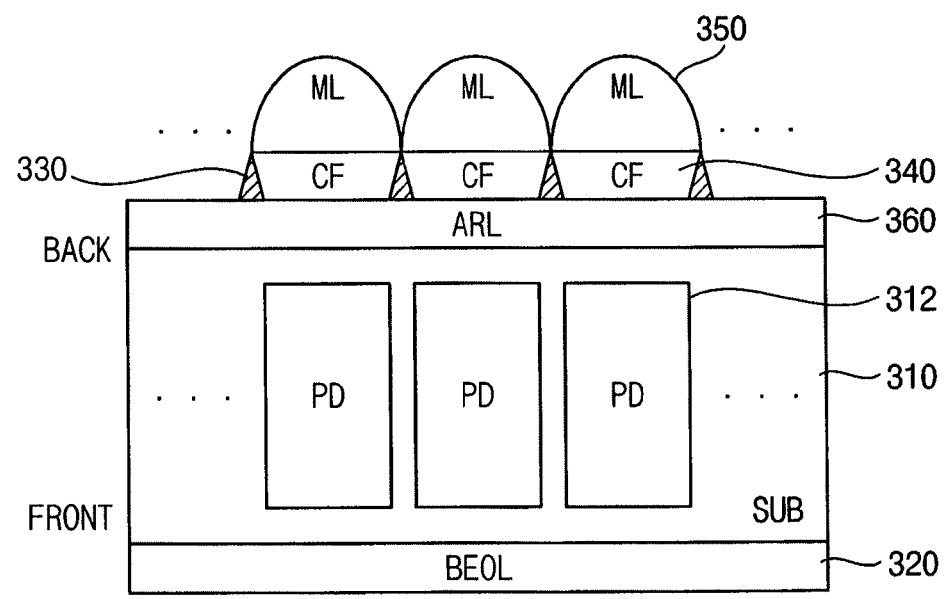

Referring to FIG. 6G, the micro lenses 350 may be laminated on the color filters 340, to facilitate guiding of incident light to the photodiode 312 of the unit pixel. The micro lenses 350 may be formed by generating a plurality of patterns using a beam penetration photo-resist, and by performing a reflow process for the plurality of patterns. Since the manufacturing process of the unit pixel array 300 illustrated in FIGS. 6A through 6F is only an exemplary embodiment, the manufacturing process of the unit pixel array 300 is not limited thereto. As described above, in the unit pixel array 300 of FIG. 5, the light path converter 330 may be disposed among or between the color filters 340 to, for example, improve the sensing efficiency. Accordingly, the incident light or light being diffracted by the micro lenses 350 may be captured by only target unit pixels (i.e., not by peripheral unit pixels) such that an undesirable optical crosstalk may be efficiently prevented. Further, the image sensor, including the unit pixel array 300 of FIG. 5, may have high sensing efficiency (e.g., light-receiving efficiency and photo sensitivity) without increasing the fill factor, and may generate high-quality images.

Figure 7:
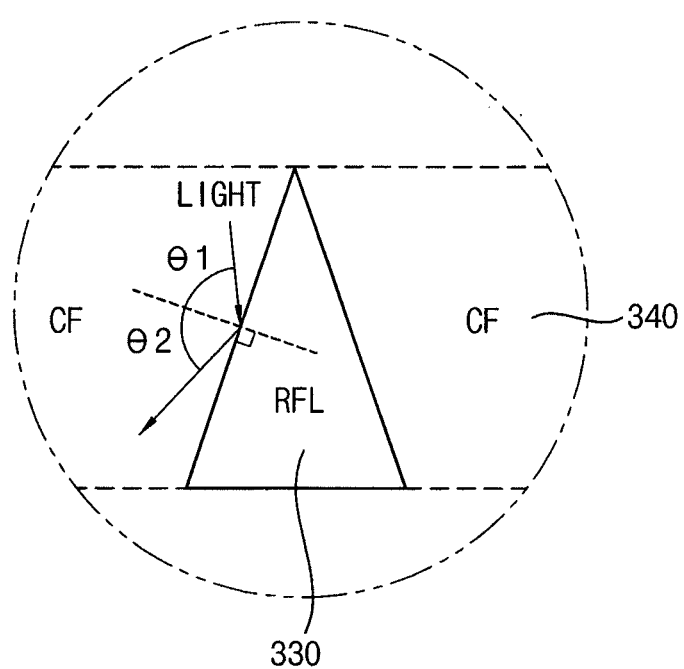
FIG. 7 illustrates a diagram of a portion of the unit pixel array of FIG. 5 in which incident light is reflected from a light path converter.

FIG. 7 illustrates a diagram of a portion of the unit pixel array of FIG. 5 in which incident light is reflected from a light path converter.

Referring to FIG. 7, each light path converter 330 may be formed in a sloped shape or with slanted side edges. Each light path converter 330 may be disposed between adjacent color filters 340; and the incident light may illuminate the light path converters 340 after passing through the color filters 340. The light path converters 330 may be formed of, for example, silicon (Si), titanium (Ti), titanium nitride (TiN), aluminum (Al), copper (Cu), and tungsten (W), or combinations thereof.

According to the law of reflection, an incidence angle of the light and a reflection angle of the light may be substantially the same on a surface of the reflective bodies 330. In an exemplary embodiment, the incidence angle of the light and the reflection angle of the light on the surface of the reflective bodies 330 may be different. Consequently, the incident light or the light by the micro lenses 350 may be reflected by the reflective bodies 330. Thus, light that would otherwise be directed toward the peripheral unit pixel may be turned toward the target unit pixel. In an exemplary embodiment, the light path converters 330 may have a triangular cross section or a trapezoidal cross section. A slope angle of the triangle (i.e., an interior angle between a horizontal bottom edge and a slanted side edge) or a slope angle of the trapezoid (i.e., an interior angle between a horizontal bottom edge and a slanted side edge) may facilitate reflection of incident light from the light path converters 330 to thereby illuminate the target unit pixels. Although the light path converters 330 may have the triangular cross section shown in FIG. 7, a cross section of the light path converters 330 is not limited thereto. For example, the cross section of the light path converter 330 may be any suitable polygonal shape having sloped or slanted side edges.

Figure 8:
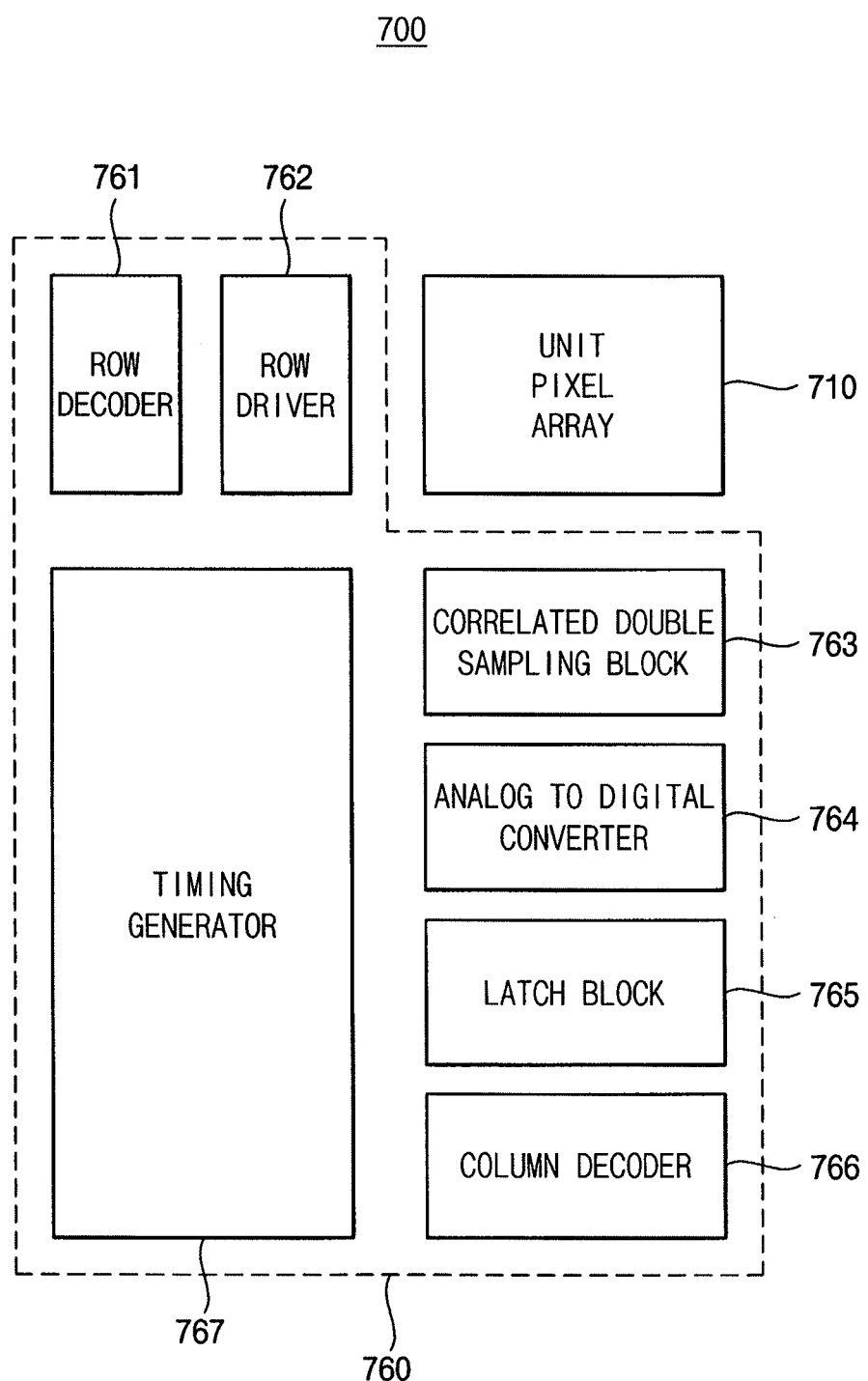
FIG. 8 illustrates a block diagram of an image sensor according to some example embodiments.

FIG. 8 illustrates a block diagram of an image sensor according to some example embodiments.

Referring to FIG. 8, an image sensor 700 may include a unit pixel array 710 (whose unit pixels are arranged in a matrix form) and a logic circuit 760 (for operating the unit pixel array 710). Further, the logic circuit 760 may include a row decoder 761, a row driver 762, a correlated double sampler 763, an analog to digital converter 764, a latch block 765, a column decoder 766, and a timing generator 767.

The unit pixel array 710 may include the unit pixels that transform the light to an electric signal. In an exemplary embodiment, the unit pixel array 710 may include a semiconductor substrate (on which the unit pixels are formed), an interlayer insulating layer (laminated on a front side of the semiconductor substrate), color filters (laminated on a back side of the semiconductor substrate), refractive bodies having sloped or slanted side edges (formed among the color filters), and micro lenses (laminated on a front side of the color filters). In another exemplary embodiment, the unit pixel array 710 may include a semiconductor substrate (on which the unit pixels are formed), an interlayer insulating layer (laminated on a front side of the semiconductor substrate), color filters (laminated on a back side of the semiconductor substrate), reflective bodies having sloped or slanted side edges (formed among the color filters), and micro lenses (laminated on a front side of the color filters). As such, the unit pixel array 710 may have the light path converters, such as the refractive bodies or the reflective bodies, which may, for example, improve the sensing efficiency. Accordingly, the incident light or the light diffracted by the micro lenses may be captured by only target unit pixels (i.e., not by peripheral unit pixels) such that undesirable optical crosstalk may be efficiently prevented. Further, the image sensor 700 may have high sensing efficiency (e.g., light-receiving efficiency and photo sensitivity) without increasing the fill factor, and may generate high-quality images.

The timing generator 767 may provide timing signals and control signals to the row decoder 761 and the column decoder 766. The row driver 762 may provide driving signals to the unit pixels of the unit pixel array 710 based on an output of the row decoder 761. According to some example embodiments, when the unit pixels of the unit pixel array 710 are arranged in a matrix form, the drive signals may be provided to each row of the matrix. The correlated double sampler 763 may sample and hold the electric signal from the unit pixel array 710. For example, the correlated double sampler 763 may double-sample a certain noise level and a signal level of the electric signal, and may output a level difference between the noise level and the signal level of the electric signal. The analog to digital converter 764 may convert an analog signal corresponding to such level difference to a digital signal. The latch block 765 may latch the digital signal to sequentially output the latched digital signal based on an output of the column decoder 766. The output of the latch block 765 may be provided to an image signal process block (not illustrated). Since the logic circuit 760 described above is only an exemplary embodiment, the logic circuit 760 is not limited thereto.

Figure 9:
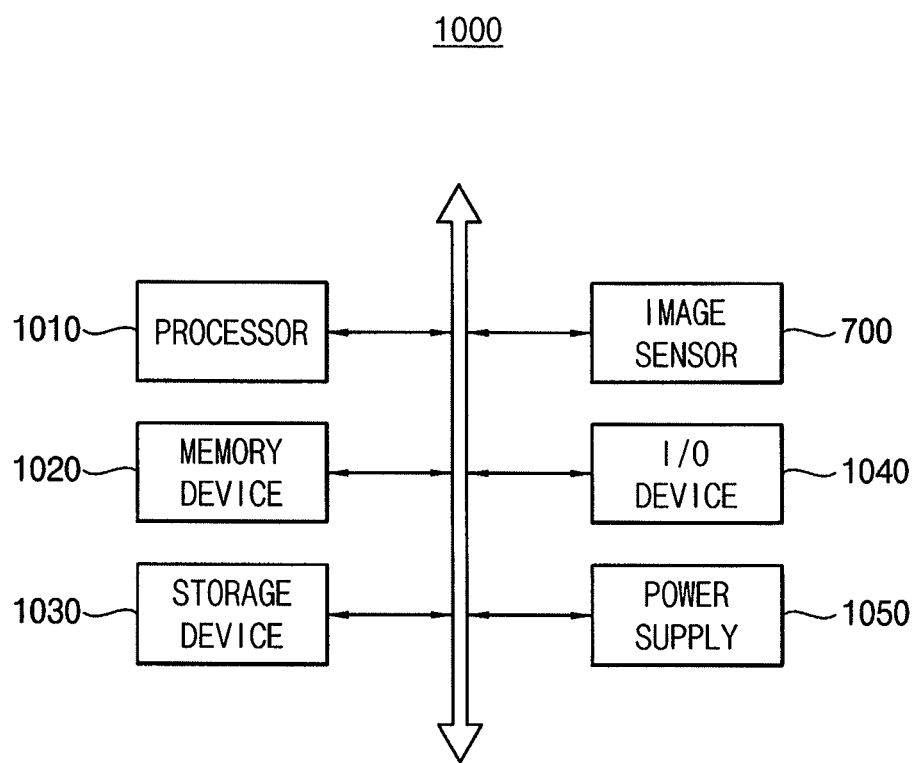
FIG. 9 illustrates a block diagram of an electronic device having an image sensor of FIG. 8.

FIG. 9 illustrates a block diagram of an electronic device having the image sensor of FIG. 8.

Referring to FIG. 9, the electronic device 1000 may include a processor 1010, a memory device 1020, a storage device 1030, an input/output (I/O) device 1040, a power supply 1050, and the image sensor. Although not illustrated in FIG. 9, the electronic device 1000 may further include a plurality of ports for communicating with a video card, a sound card, a memory card, a USB device, other electronic devices, etc.

The processor 1010 may perform various computing functions or tasks. According to some example embodiments, the processor 1010 may be, e.g., a micro processor, a central processing unit (CPU), or other suitable types of processors. The processor 1010 may be coupled to the memory device 1020, the storage device 1030, and the I/O device 1040 through a bus such as an address bus, a control bus, a data bus, or other suitable bus types. According to some example embodiments, the processor 1000 may be also coupled to an extended bus such as a peripheral component interconnection (PCI) bus. The memory device 1020 may store data for operating the electronic device 1000. For example, the memory device 1020 may be a dynamic random access memory (DRAM) device, a static random access memory (SRAM) device, an erasable programmable read-only memory (EPROM) device, an electrically erasable programming read-only memory (EEPROM) device, a flash memory device, or other suitable types of memory devices. The storage device 1030 may be a solid state drive, a hard disk drive, a CD-ROM, etc. The I/O device 1040 may include input devices such as a keyboard, a keypad, a mouse, etc, and output devices such as a printer, a display, etc. The power supply 1050 may provide operation power for the electronic device 1000.

The image sensor 700 may communicate with the processor 1010 through the buses or other communication links. According to some example embodiments, the image sensor 700 may be integrated with the processor 1010 in one chip. Meanwhile, the electronic device 1000 may be a computer, a digital camera, a cellular phone, a personal digital assistant (PDA), a scanner, a navigation system, a video phone, a monitoring system, an auto-focusing system, an image stabilizing system, etc.

As described above, a unit pixel array of an image sensor according to some example embodiments has a plurality of light path converters such as refractive bodies or reflective bodies to improve sensing efficiency. Accordingly, incident light or light being diffracted by micro lenses may be captured by only target unit pixels (i.e., not by peripheral unit pixels) such that an undesirable optical crosstalk may be efficiently prevented. Thus, embodiments may be applied to an image sensor, and an electronic device having the image sensor such as a computer, a digital camera, a cellular phone, a personal digital assistant (PDA), a scanner, a navigation system, a video phone, a monitoring system, an auto-focusing system, an image stabilizing system, or other suitable electronic devices.

Example embodiments provide a unit pixel array for an image sensor capable of preventing (e.g., reducing) an undesirable optical crosstalk. According to some example embodiments, the image sensor having the unit pixel array may have high sensing efficiency (e.g., light-receiving efficiency and photo sensitivity) and may generate high-quality images.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A unit pixel array, comprising:
a semiconductor substrate having a plurality of unit pixels;
an interlayer insulating layer including at least one gate terminal of a transistor and at least one conductive line on a front side of the semiconductor substrate;
a plurality of color filters on a back side of the semiconductor substrate;
a plurality of light path converters, each of the light path converters being adjacent to at least one color filter, and having a pair of slanted side edges on opposing ends of a horizontal bottom edge;
an anti-reflective layer between the color filters and the back side of the semiconductor substrate, the anti-reflective layer passing incident light and preventing the incident light from reflecting on the back side of the semiconductor substrate; and
a plurality of micro lenses on the color filters, wherein a distance between opposing slanted side edges of adjacent light path converters is greater than a distance between the pair of slanted side edges of each of the light path converters and wherein each slanted side edge of the pair of slanted side edges of each of the light path converters extends at a same angle from an uppermost surface to a lowermost surface of the at least one color filter, wherein:
the light path converters are reflective bodies that reflect the incident light,
the reflective bodies include silicon (Si), titanium (Ti), titanium nitride (TiN), aluminum (Al), copper (Cu), tungsten (W), or combinations thereof, and
the reflective bodies have a triangular cross section or a trapezoidal cross section.

2. The unit pixel array as claimed in claim 1, wherein the reflective bodies have a slope angle such that light incident on the reflective bodies is reflected and illuminates target unit pixels.

3. The unit pixel array as claimed in claim 1, wherein the color filters include at least one red filter, at least one green filter, and at least one blue filter.

4. The unit pixel array as claimed in claim 1, wherein the color filters include at least one yellow filter, at least one cyan filter, and at least one magenta filter.

5. An image sensor, comprising:
a unit pixel array that generates an image signal by performing photoelectric transformations; and
a logic circuit that processes the image signal,
wherein the unit pixel array includes:
a semiconductor substrate having a plurality of unit pixels;
an interlayer insulating layer including at least one gate terminal of a transistor and at least one conductive line on a front side of the semiconductor substrate;
a plurality of color filters on a back side of the semiconductor substrate;
a plurality of light path converters, each of the light path converters being adjacent to at least one color filter, and having a pair of slanted side edges on opposing ends of a horizontal bottom edge;
an anti-reflective layer between the color filters and the back side of the semiconductor substrate, the anti-reflective layer passing incident light and preventing the incident light from reflecting on the back side of the semiconductor substrate; and
a plurality of micro lenses on the color filters, wherein a distance between opposing slanted side edges of adjacent light path converters is greater than a distance between the pair of slanted side edges of each of the light path converters and wherein each slanted side edge of the pair of slanted side edges of each of the light path converters extends at a same angle from an uppermost surface to a lowermost surface of the at least one color filter, wherein:
the light path converters are reflective bodies that reflect the incident light,
the reflective bodies include silicon (Si), titanium (Ti), titanium nitride (TiN), aluminum (Al), copper (Cu), tungsten (W), or combinations thereof, and
the reflective bodies have a triangular cross section or a trapezoidal cross section.

6. The image sensor as claimed in claim 5, wherein the reflective bodies have a slope angle such that light incident on the reflective bodies is reflected and illuminates target unit pixels.

7. A unit pixel array, comprising:
a semiconductor substrate having a plurality of unit pixels, the semiconductor substrate including a plurality of color filters on a back side thereof, an interlayer insulating layer including at least one gate terminal of a transistor and at least one conductive line on a front side of thereof, a plurality of light path converters on the back side thereof, and an anti-reflective layer between the color filters and the back side of the semiconductor substrate, wherein:
each color filter is adjacent to at least two light path converters,
the anti-reflective layer passes incident light and prevents the incident light from reflecting on the back side of the semiconductor substrate,
each of the at least two light path converters has side edges to direct incident light towards a different light receiver and is made from a same contiguous piece of material extending between the side edges, wherein each of the side edges of the at least two light path converters extend at a same angle from an uppermost surface to a lowermost surface of the color filter, and
the plurality of light path converters are reflective bodies, wherein:
the reflective bodies include silicon (Si), titanium (Ti), titanium nitride (TiN), aluminum (Al), copper (Cu), tungsten (W), or combinations thereof, and
the reflective bodies have a triangular cross section or a trapezoidal cross section.

8. The unit pixel array as claimed in claim 1, wherein the pair of slanted side edges of each light path converter overlaps a different light receiver.

9. The unit pixel array as claimed in claim 1, wherein each of the light path converters is made from a same material extending between the pair of slanted side edges.

10. The unit pixel array as claimed in claim 1, wherein each of the light path converters is made from an integral one-piece construction and wherein the horizontal bottom edge of each light path converter is continuous and substantially coplanar between the pair of slanted edges of the light path converter.

11. The unit pixel array as claimed in claim 1, wherein each of the light path converters has a height substantially equal to a thickness of each of the color filters.

12. The unit pixel array as claimed in claim 1, wherein the horizontal bottom edge of each of the plurality of light path converters is substantially coplanar with a bottom surface of the color filters.

13. The unit pixel array as claimed in claim 7, wherein a distance between the at least two light path converters adjacent each color filter is greater than a distance between side edges of each of the at least two light path converters.

14. The unit pixel array as claimed in claim 1, wherein at least one light path converter has an upwardly tapered shape, and a horizontal upper surface of the at least one light path converter directly contacts a bottom surface of at least one micro lens.

15. The unit pixel array as claimed in claim 1, further comprising
an another anti-reflective layer between the interlayer insulating layer and the front side of the semiconductor substrate, the another anti-reflective layer passing the incident light and preventing the incident light from reflecting on the interlayer insulating layer.

* * * * *